United States Patent [19]

Albright et al.

[11] Patent Number: 5,460,660
[45] Date of Patent: Oct. 24, 1995

[54] APPARATUS FOR ENCAPSULATING A PHOTOVOLTAIC MODULE

[75] Inventors: Scot P. Albright, El Paso, Tex.; Larry M. Dugan, Boulder, Colo.

[73] Assignee: Photon Energy, Inc., Golden, Colo.

[21] Appl. No.: 95,381

[22] Filed: Jul. 21, 1993

[51] Int. Cl.⁶ ............................................. H01L 31/048
[52] U.S. Cl. ................................................ 136/251
[58] Field of Search .................................... 136/251

[56] References Cited

U.S. PATENT DOCUMENTS

| | | | |
|---|---|---|---|
| 3,268,366 | 8/1966 | Guvot | 136/251 |
| 4,009,054 | 2/1977 | Gochermann et al. | 136/251 |
| 4,045,245 | 8/1977 | Coleman et al. | 136/251 |
| 4,053,326 | 10/1977 | Forrat | 136/256 |
| 4,231,807 | 11/1980 | Keeling et al. | 136/251 |
| 4,234,351 | 11/1980 | Deminet et al. | 136/251 |
| 4,239,555 | 12/1980 | Scharlack et al. | 136/251 |
| 4,249,519 | 2/1981 | Martinez | 126/570 |
| 4,266,383 | 5/1981 | Krueger et al. | 52/400 |
| 4,287,382 | 9/1981 | French | 136/244 |
| 4,332,241 | 6/1982 | Dalstein et al. | 126/711 |
| 4,571,446 | 2/1986 | Yamazaki | 136/244 |
| 4,578,526 | 3/1986 | Nakano et al. | 136/251 |
| 4,625,070 | 11/1986 | Berman et al. | 136/249 |
| 4,633,032 | 12/1986 | Oido et al. | 136/251 |
| 4,686,321 | 8/1987 | Kishi | 136/244 |
| 4,724,010 | 2/1988 | Okaniwa et al. | 136/246 |
| 4,832,755 | 5/1989 | Barton et al. | 136/251 |
| 4,847,669 | 7/1989 | Yamazaki et al. | 136/251 |
| 5,022,930 | 6/1991 | Ackerman et al. | 136/251 |
| 5,128,181 | 7/1992 | Kunert | 428/34 |
| 5,217,540 | 6/1993 | Ogura | 136/251 |
| 5,252,141 | 10/1993 | Inoue et al. | 136/251 |
| 5,289,999 | 3/1994 | Naujeck et al. | 244/173 |

FOREIGN PATENT DOCUMENTS

| | | | |
|---|---|---|---|
| 3520424 | 12/1986 | Germany | 136/251 |
| 54-4170 | 1/1982 | Japan | 136/251 |

OTHER PUBLICATIONS

D. C. Carmichael et al., *Conference Record*, 12th IEEE Photovoltaic Specialists Conf. (1976), pp. 317–331.

J. Anguet and Y. Salles, "Industrial Technology for the Economic and Viable Encapsulation for Large Scale Panels", Commission of the European Communities, (1981), EUR 7163FR.

*Primary Examiner*—Aaron Weisstuch
*Attorney, Agent, or Firm*—Sheridan Ross & McIntosh

[57] ABSTRACT

The subject inventions concern various photovoltaic module designs to protect the module from horizontal and vertical impacts and degradation of solar cell efficiency caused by moisture. In one design, a plurality of panel supports that are positioned adjacent to the upper panel in a photovoltaic module absorb vertical forces exerted along an axis perpendicular to the upper panel. Other designs employ layers of glass and tempered glass, respectively, to protect the module from vertical impacts. A plurality of button-shaped channels is used around the edges of the photovoltaic module to absorb forces applied to the module along an axis parallel to the module and direct moisture away from the module that could otherwise penetrate the module and adversely affect the cells within the module. A spacer is employed between the upper and lower panels that has a coefficient of thermal expansion substantially equivalent to the coefficient of thermal expansion of at least one of the panels.

52 Claims, 6 Drawing Sheets

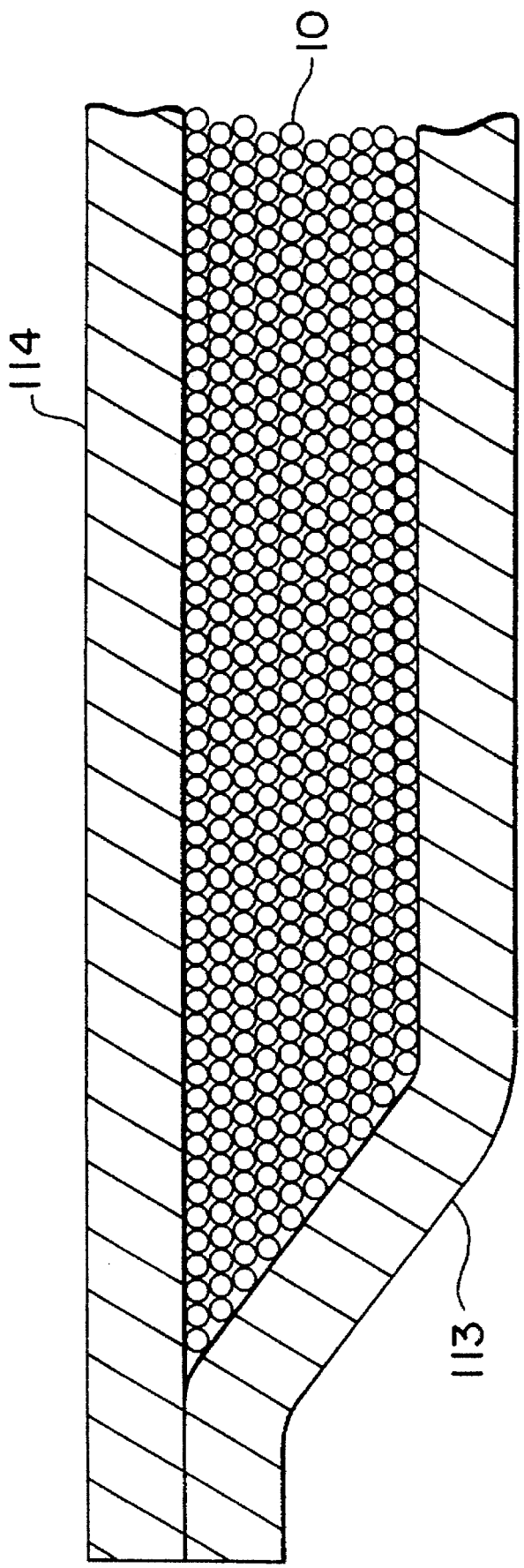

APPARATUS FOR ENCAPSULATING A PHOTOVOLTAIC MODULE

This invention was made with Government support under Subcontract No. ZN-0-19019-1 awarded by the Department of Energy. The Government has certain rights in this invention.

FIELD OF THE INVENTION

The present invention generally relates to an apparatus for sealing and protecting solar cells from the external environment and specifically relates to a photovoltaic module configuration for sealing and protecting thin film solar cells.

BACKGROUND OF THE INVENTION

In the future, as energy demands rise and fossil fuel supplies decrease, it will become increasingly important to harness the energy of renewable energy sources such as solar energy. Although solar cells are presently capable of harnessing solar energy, the external terrestrial environment presents numerous problems requiring systems to protect solar cells. The solar cell, for example, must be protected from moisture which will degrade cell efficiency and impacts (e.g., from hail, dust, etc.) which may damage or destroy the cell.

To protect solar cells, existing technology encapsulates the solar cell in a "sandwich" structure known as a photovoltaic module. The structure includes upper and lower panels sealed at their perimeters to define a sealed, inner space between the panels. The solar cell is located within the inner space. To effectively protect the solar cell, the photovoltaic module must be able to withstand a number of threats to module integrity including vertical and horizontal shocks while protecting the inner space from moisture penetration that can damage the cells.

There are several approaches to protect against vertical shocks. In a first approach, a thermoplastic strip is positioned underneath the perimeter of the photovoltaic module. An example is U.S. Pat. No. 4,249,519. Panels designed in this manner have been found to fail in a number of situations, such as hail storms.

In a second approach, flexible layered glass panels are employed as the upper panel. An example is U.S. Pat. No. 4,571,446. The problem with this approach is that the bending of the panels in response to vertical shocks may damage the solar cell. This is especially true for thin film solar cells deposited on the lower surface of the upper panel which can be damaged by elongation of the lower surface of the panel during flexing of the panels.

In a third approach, tempered glass is supported by a continuous layer of ethyl vinyl acetate. An example is U.S. Pat. No. 4,625,070. The problem with this approach is that the ethyl vinyl acetate photodegrades over time into a material that adversely affects the operation of the solar cells in the module, thereby decreasing cell efficiency.

To protect against horizontal shocks, it is known to use thermoplastic strips contacting the outer perimeter of the photovoltaic module. Examples are U.S. Pat. Nos. 4,633,032; 4,332,241; 4,266,383; 4,249,519; and 4,003,363. The problem with this approach is that the strips promote penetration of moisture through the perimeter seal into the inner space between the upper and lower panels where the moisture can adversely affect the solar cells. Consequently, there is a need for a device to protect a photovoltaic module against horizontal shocks that also reduces the possibility of moisture penetrating the seal between the panels.

To seal the perimeters of the upper and lower panels, it is known to use sealing structures that incorporate thermoplastic materials such as vinyl strips and various resins. Examples are U.S. Pat. Nos. 4,633,032; 4,249,519; and 4,003,363. Unfortunately, these sealing structures are still susceptible to seal failure, thereby permitting water to penetrate into the space between the upper and lower panels.

SUMMARY OF THE INVENTION

One invention for protecting a photovoltaic module or panel from vertical shocks or impacts includes a plurality of panel supports positioned adjacent to the upper panel in a photovoltaic module to absorb forces exerted along an axis perpendicular to the upper panel, i.e., vertical forces. In one embodiment, the panel supports absorb the forces by either compression or elongation along the perpendicular axis. Preferably, panel supports are supported on a lower panel and are spaced from one another in a substantially uniform pattern. Preferably, this results in at least one shock absorbing support located to absorb shocks in the central portion of the panel. In one configuration, panel supports are used on about a 6-inch spacing and are composed of a material having a displacement of about $1/32$ inches at about 5.0 psi, which corresponds to the maximum probable vertical force to be applied to the upper panel. Preferably, the maximum gap between the lower surface of the upper panel and panel support is about 0.030 inches and the cross-sectional area of each panel support is at least about 0.20 square inches. The panel support spacing, maximum gap between the panel support and upper panel, and cross-sectional area of the panel support are all dependent upon the composition, structure and thickness of the upper panel and the maximum probable vertical force to be applied to the upper panel. This embodiment recognizes that existing photovoltaic modules, which use a thermoplastic strip around the module perimeter for shock absorption, fail to adequately absorb vertical shocks in normal applications for at least the following two reasons: (i) a force, especially in the panel center, is not transferred quickly enough to the thermoplastic strip to avoid panel failure and (ii) the lack of central panel support increases the effective magnitude of a force applied to the central panel area by leverage of the force about the nearest fixed point which is at the panel's perimeter.

In yet another invention for protecting a photovoltaic module from vertical impacts, a substantially rigid upper panel is located adjacent to the upper surface of a lower panel to absorb forces applied to the upper panel along an axis perpendicular to the upper panel, i.e., vertical forces. The solar cell is located below the lower panel. Preferably, the upper panel is composed of a material having a modulus of elasticity of about $10 \times 10^6$ psi. In one aspect of the invention, the upper panel is composed of tempered glass. In another aspect of the invention, a gap of no more than 0.030 inches exists between the lower surface of the upper panel and the upper surface of the lower panel. The magnitude of the gap depends upon the composition, structure and thickness of the upper panel and the maximum probable vertical force to be exerted on the upper panel.

In another invention for protecting a photovoltaic module from vertical impacts, the invention includes an upper panel that is composed of tempered glass and a space underlying the tempered glass. It was discovered that an upper panel composed of tempered glass does not need the support of a continuous ethyl vinyl acetate layer to withstand vertical impacts.

In another invention disclosed herein, a plurality of spaced channels are used around the edges of the photovoltaic module to absorb forces applied to the module along an axis parallel to the module, i.e., horizontal forces, while also directing moisture away from the module, thereby reducing the possibility of moisture penetrating into the inner space. Each channel may be composed of any material having an elasticity limit of about 40 to 70 durometer shore A, preferably about 60 durometer shore A, which corresponds to the maximum probable horizontal force to be applied to the photovoltaic module. The channel spacing and length depend upon the shape, composition and structure of the channels and the maximum probable horizontal force. Preferably, the spacing is no greater than about 7.0 inches and length about 0.25 to about 0.50 inches. The present invention directs water away from the module by using a plurality of spaced channels around the module perimeter. This design addresses the water runoff problems caused by the use in existing modules of channels that are continuous around the module perimeter. In existing modules, water is channeled by the continuous channel(s) along the module's perimeter and tends to collect adjacent the seal at the lower edges of the module. In contrast, the present invention's use of a plurality of spaced or discontinuous channels prevents collection by allowing water to drain off between the channels.

Another invention directed to absorbing horizontal forces and directing moisture away from the panel includes a channel with an outer channel surface located opposite the outer edge of the photovoltaic module and with a centrally located portion that is elevated over portions of the channel surface on either side of the centrally located portion. This button-shape design directs water away from the photovoltaic module. This design is based on the recognition that existing channels have pockets or ledges adjacent to the module that collect water near the seal of the photovoltaic module.

Another invention that is directed to improving the integrity of the seal employs a sealing spacer having a coefficient of thermal expansion substantially equivalent to the coefficient of thermal expansion of at least one of the panels. Such a spacer reduces the possibility of the seal between the panel and the spacer being broken by fluctuations in temperature. Preferably, the upper panel is composed of glass having a coefficient of thermal expansion of about $4.7 \times 10^{-6}$ to about $6.8 \times 10^{-6}/°$ F./inch and the spacer is composed of stainless steel or glass. The present invention employs such a spacer based on the recognition that seals in existing modules have failed as a result of incompatible coefficients of thermal expansion between the spacer and the adjacent panels.

BRIEF DESCRIPTION OF THE DRAWINGS

FIG. 6 is a cross-sectional view of a fifth embodiment of a photovoltaic module showing a formed glass backcap.

DETAILED DESCRIPTION OF THE INVENTION

To absorb vertical forces, a first embodiment of a photovoltaic module includes a panel that is substantially transparent to light, a solar cell located adjacent to the interior side of the panel, and a number of panel supports positioned adjacent to the panel. The panel supports each absorb forces exerted on the panel along an axis perpendicular to the panel by either compression or elongation of the panel support along the perpendicular axis.

Figure 1:
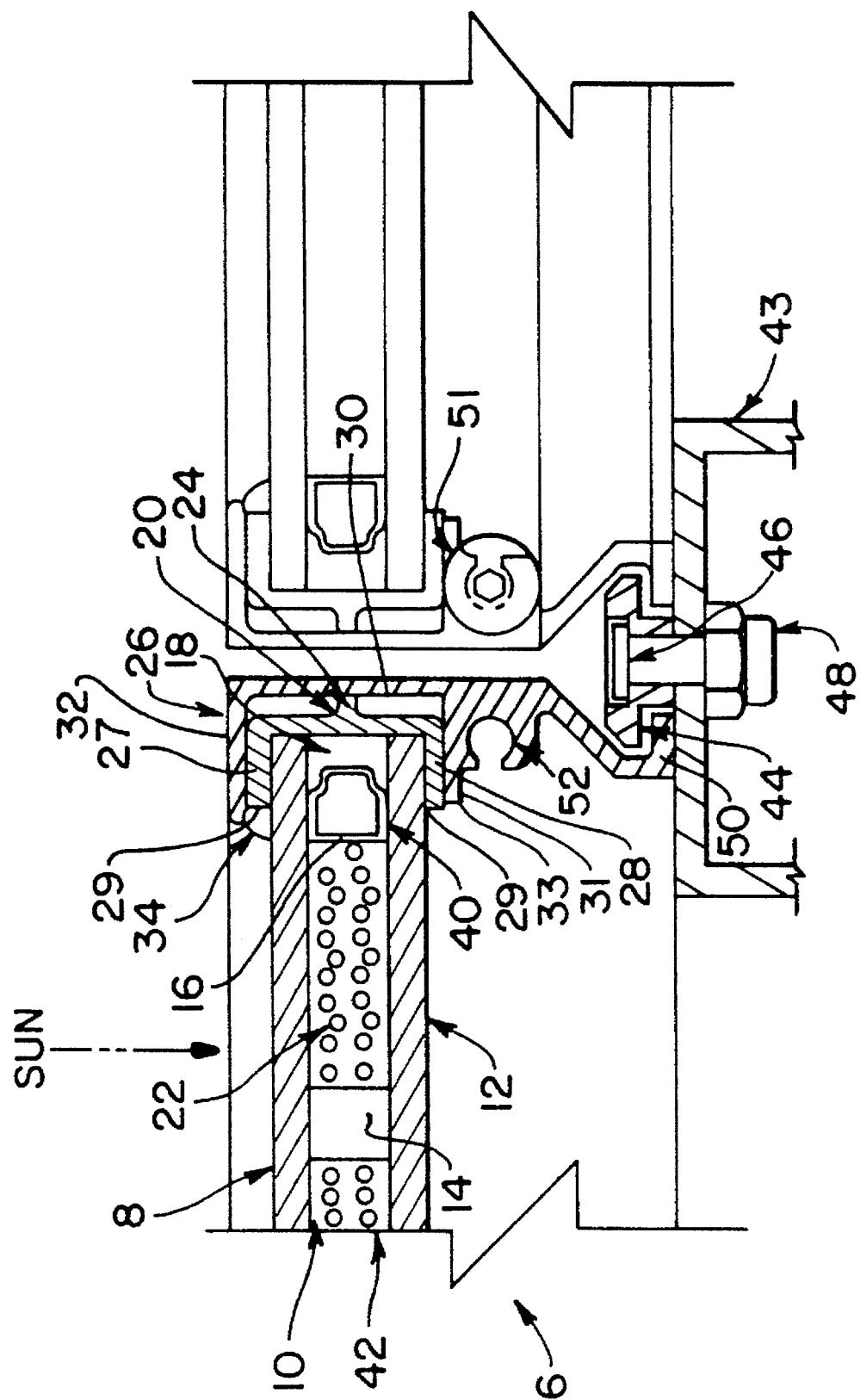
FIG. 1 is a cross-sectional view of a first embodiment of a photovoltaic module showing various components including the spacer, upper and lower panels, channels, and panel supports.
Figure 2:
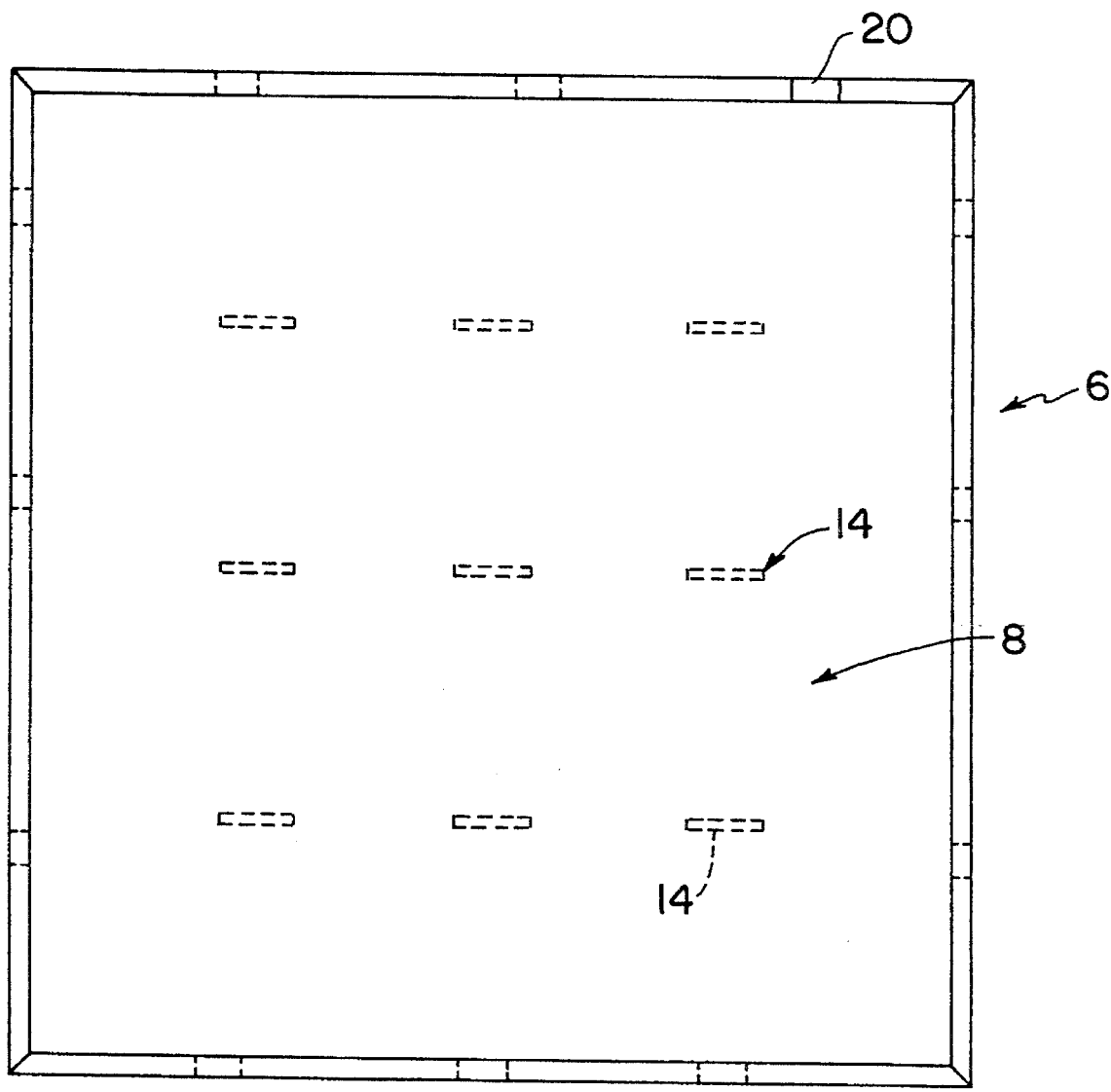
FIG. 2 is a plane view of a photovoltaic module showing the placement of the panel supports and channels.

Referring to FIGS. 1 and 2, the first embodiment of a photovoltaic module 6 includes an upper panel 8, thin film solar cell 10, lower panel 12, a plurality of panel supports 14 that deform to absorb shocks, spacer 16, first sealant 18, and plurality of channels 20. The upper panel 8 may be any material impervious to water penetration and capable of passing the wavelengths of light falling within the bandgap of thin film solar cell 10. Preferably, the thin film solar cell 10 is cadmium-based and has a bandgap of about 2.4 electron volts (ev). Thin film solar cell 10 is preferably deposited on upper panel 8 as it will have no inactive areas attributable to light blockages caused by panel support 14, unlike a thin film solar cell 10 deposited on the lower panel 12. Additionally, depositing thin film solar cell 10 on the upper panel 8, as opposed to the lower panel 12, permits desiccant 22 to be placed in the space between the upper and lower panels 8, 12 to absorb water penetrating into the space without interfering with the light impinging the cell 10. The upper panel 8 preferably comprises glass having a thickness of about 0.120 inches. The lower panel 12 may be any material impervious to water penetration, such as glass or metal. The upper and lower panes 8, 12 preferably have the same coefficient of thermal expansion and the same dimensions which are about 2.0 feet by about 2.0 feet.

Panel supports 14 include a material having a displacement of about 1/32 inches at about 5.0 psi, which corresponds to the maximum probable vertical force which will be applied to the upper panel 8 in most applications. Preferably, the material will comprise a resilient rubber material. Preferably, the panel support is a shock absorbing device sold under the trademark "SUPER SPACER" by a company having the tradename "EDGETECK." The "SUPER SPACE" is composed of silicone and desiccant. The "SUPER SPACER" preferably has no adhesive on the side nearest to the upper panel 8 to avoid the "SUPER SPACER" from adhering to, and thereby damaging, the thin film solar cell 10.

The height of the panel support 14 depends upon the space between the upper and lower panels 8, 12 and thickness of thin film solar cell 10. Typically, the spacing between the upper and lower panels 8, 12 is about 0.090 inches and the thin film solar cell 10 has a thickness typically less than about 20 microns. The spacing between the upper and lower panels 8, 12 should not be too large or else pressure changes in the gas-filled space between the panels caused by impacts or altitude changes, among other things, may cause one or both panels to fracture. Generally, a wider spacing requires more perimeter space for spacer 16 and first sealant 18 to provide an adequate seal around the panel perimeter. Preferably, the minimum height of the panel support 14 will be about 0.030 inches less than the distance between upper and lower panels 8, 12.

The panel support 14 may have any shape, including, without limitation, cylindrical, square, triangular, or rectangular. The preferred shape is rectangular with the long axis of the rectangle being horizontal. Preferably, the rectangle has a length ranging from about 1.0 to about 2.0 inches and a width ranging from about 0.19 to about 0.37 inches.

The cross-sectional or load bearing area of panel support 14 depends upon the maximum probable vertical force to be applied to the upper panel 8 and the composition, structure and thickness of panel support 14. In most applications, the maximum probable vertical force is about 0.2 psi and the cross-sectional area of the panel support face parallel to upper panel 8 is at least about 0.19 square inches.

As shown in FIG. 2, the plurality of panel supports 14 preferably have a substantially even distribution across the cross-sectional area of the photovoltaic module 6. The use of a plurality of panel supports 14 in the photovoltaic module 6 enables the force caused by impacts on the upper panel 8 to be rapidly transferred to the panel support 14 before plastic deformation or fracturing of the upper panel 8 and reduces the increase in magnitude of the force in existing photovoltaic modules caused by leveraging of the force about the nearest fixed point. Unlike existing modules in which the nearest fixed point is typically at the panel's perimeter, the present invention has the nearest fixed point at the nearest point of contact between upper panel 8 and panel support 14 in response to the application of the force to upper panel 8.

The spacing between panel supports 14 is a function of the composition, structure and thickness of the upper panel 8 and the maximum probable vertical force to be applied to the upper panel 8. For an upper panel 8 of untempered glass having a thickness of about 0.12 to about 1.0 inches and a maximum probable vertical force of about 0.2 psi, the panel supports 14 will have a spacing of about 6.0 inches. The spacing will increase as the strength of the upper panel 8 increases and/or the maximum probable vertical force decreases.

Preferably, panel support 14 is attached to the lower panel 12 but not to the upper panel 8 as the thin film solar cell 10 is preferably deposited on the upper panel 8. The maximum gap between panel support 14 and thin film solar cell 10 depends upon the maximum probable vertical force to be exerted on the upper panel 8 and the composition and thickness of the upper panel 8. Preferably, the gap is small enough that panel support 14 is capable of contacting panel support 14 and absorbing the maximum probable vertical force exerted on upper panel 8 before the force fractures the upper panel 8. If the gap is too large, panel support 14 may not be capable of contacting panel support 14 and absorbing the maximum probable vertical force exerted on upper panel 8 before the upper panel 8 fractures. Preferably, the gap is less than about 0.03 inches.

In operation, a force is imparted on the upper panel 8, such as the force imported by a hail stone. Upper panel 8 elastically deforms and contacts the nearest panel support(s) 14. One or more of the nearest panel support(s) 14 elastically deform by compression and thereby absorb a portion of the force. The unabsorbed force is transferred by the panel supports to lower panel 12. A portion of the force is also transmitted along the upper panel 8 to the lower arm 28 of channel 20 which absorbs the force through elastic deformation in the form of compression. The elastic deformation of panel support(s) 14, upper and lower panels 8, 12, and lower arm 28 all cooperate to absorb the force. In one aspect of the invention, the panel support(s) may be located such that they absorb a portion of the force through elongation rather than compression.

A plurality of channels, located between the photovoltaic module and a frame absorb forces applied to the photovoltaic module along an axis parallel to the photovoltaic module, i.e. horizontal forces, and direct water away from the panel. The channel has an interior surface that is located adjacent to the outer edge of the photovoltaic module and an exterior surface that is located adjacent to the frame. The exterior surface has at least one centrally located portion that is elevated over portions of the exterior surface located on both sides of the centrally located portion to substantially direct water away from the photovoltaic module and, in particular, away from the seal between the upper and lower panels and thereby prevent moisture from reaching the thin film solar cell. Further, the channel configuration creates gaps between the channel and the frame that are exposed to the ambient atmosphere to provide an area for water to collect and evaporate through exposure to the ambient atmosphere.

Referring again to FIG. 1, channel 20 has at least one nub 24 to movably engage the frame 26 and upper and lower arms 27, 28 to engage the photovoltaic module 6 and frame 26. The outer surface of channel 20 may be any shape so long as the central portion is elevated over the two adjacent portions. For example, the outer surface may be a shape such as a semi-circle, a triangle, or the nub/button shape shown in FIG. 1. Preferably, the channel 20 has the configuration shown in FIG. 1 with nub 24 located along the center line of the photovoltaic module 6. The height of nub 24 depends upon the thickness of channel 20 and the distance between the edge of the photovoltaic module 6 and frame 26. Preferably, the channel 20 thickness between the exterior edge of photovoltaic module 6 and the gap 30 is about 0.06 to about 0.07 inches and the height of the nub 24 is about 0.06 to about 0.07 inches. The cross-sectional area of the face of the nub 24 contacting frame 26 depends upon the maximum probable horizontal force to be exerted on the photovoltaic module 6. For a maximum probable horizontal force of 50 pounds, nub 24 will have a cross-sectional area of about 0.036 square inches. Upper and lower arms 27, 28 preferably have a length from arm face 29 to the outer edge of panels 8, 12 of about 0.25 to about 0.31 inches and a thickness of about 0.06 to about 0.07 inches. Gap 30 has a height of about 0.20 to about 0.40 inches, preferably about 0.30 inches and thickness of about 0.06 to about 0.07 inches. Channel 20 may be composed of any material having a durometer shore A of about 50 to 70, preferably 60, which corresponds to the maximum probable horizontal force to be applied to the photovoltaic module 6 in most applications. Preferably, the material will comprise thermoplastics, such as rubber (preferably, EPDM (a derivative of ethylene propylene)) that can retain its properties over a module life of 20 years.

Referring to FIG. 2, the plurality of channels 20 are spaced from one another around the perimeter of the photovoltaic module 6 to avoid moisture entrapment in gaps 30 and elsewhere adjacent to the seal established between the upper panel 8 and lower panel 12. Specifically, by being spaced from one another, the plurality of channels 20 permit moisture to drain away from the module 6 via spaces between the channels. The number of channels 20 for each edge of the photovoltaic module 6 depends upon the shape, composition and structure of channels 20 and the maximum probable horizontal force to be applied to the photovoltaic module 6. Preferably, the spacing between channels 6 is about 3.0 to 7.0 inches. The width of each of the plurality of channels 20 is preferably about 0.25 to about 0.50 inches.

Referring again to FIG. 1, the distance between upper and lower arms 27, 28 is equivalent to the thickness of the photovoltaic module 6, which is typically about 0.32 to about 0.50 inches. The distance between the outer surfaces of upper and lower arms 27, 28 depends upon the distance between lower and upper frame arms 31, 32. An interface 33 between channel 20 and photovoltaic module 6 permits liquids and gases, such as water and water vapor, to migrate along the interface 33. Accordingly, the channel 20 preferably is removably connected to the photovoltaic module 6 and is held in place by either pressure or friction or by second sealant 34. A second sealant 34 may be deposited adjacent to the upper arm 27 to prevent moisture from penetrating into the interface 33 from above the photovoltaic module 6. The second sealant 34 may be any water resistant material including black silicone rubber.

The spacer 16 has substantially the same coefficient of thermal expansion as at least one of the panels 8, 12 to reduce the possibility of the seal being broken by temperature fluctuations. The breaking of the seal would expose the solar cell to the exterior environment. Preferably, spacer 16 is composed of 430 stainless steel, steel (cold rolled A366 sheet) or glass and the upper panel is composed of glass having a coefficient of thermal expansion of about $4.8 \times 10^{-6}/°$ F./inch. Stainless steel has a coefficient of thermal expansion of about $5.8 \times 10^{-6}/°$ F./inch and cold rolled steel a thermal expansion coefficient of about $6.8 \times 10^{-6}/°$ F./inch.

The height of spacer 16 is substantially equivalent to the distance between the upper and lower panels 8, 12. The width of the spacer 16 should be sufficiently broad for the spacer to be firmly held in place between the panels 8, 12. For example, if the width of spacer 16 is too narrow, spacer 16 may be unstable and cause the integrity of the third sealant 40 to be ruptured by normal impacts to the photovoltaic module 6. Generally, the greater the spacer width, the more stable is spacer 16. Preferably, the height of the spacer 16 is no less than about 0.075 inches and the width and length are about 0.25 to about 0.312 inches. The length of spacer 16 is sufficient to enclose the interior space of photovoltaic module 6 housing solar cell 10.

Referring again to FIG. 1, the first sealant 18 is located adjacent to spacer 16 and a third sealant 40 is at the boundary between the spacer 16 and upper and lower panels 8, 12. First and third sealants 18, 40 may be any water resistant material. Preferably first sealant 18 is polyurethane and third sealant 40 is polyisobutylene. Polyurethane advantageously has a rate of cure that can be accelerated by heating to 120° F. without affecting sealant performance, adhesion characteristics, tensile properties and durability. The first and third sealants 18, 40 should be sufficient to resist degradation caused by wind loads and thermo-expansion, capable of adhering to glass and aluminum, and able to be applied with automated metering equipment. Polyisobutylene advantageously has the capability to be applied at 190° F., excellent wetting and adhesion characteristics to glass and aluminum, a low moisture vapor transmission rate (MVTR) (e.g., its MVTR is about 0.01 PERMS), resistance to temperature extremes and degradation from ultraviolet light, and the ability to be applied with conventional butyl extruders. The surfaces of the spacer 16 and upper and low panels 8, 12 should be heated to approximately 190° F. to ensure wetting and adhesion of the polyisobutylene.

The interface between spacer 16 and upper and lower panels 8, 12, containing third sealant 40, creates a "pinch point" to inhibit water migration into the area of the solar cell 10. As used herein, "pinch point" refers to a small opening or channel along which water vapor may migrate. The use of a pinch point substantially reduces the ability of water to penetrate the space 42. The length of the "pinch point" is directly related to the length of the interface.

A frame 26 supports a photovoltaic module 6 and a series of frames 26 support a number of photovoltaic modules 6 to form an array. The frame 26 includes any material that is resistant to deterioration in the environment. The preferred material for the frame 26 is aluminum. The upper portion of the frame 26 includes U-shaped frame arms 31, 32 for housing the photovoltaic module 6. Lower and upper frame arms 31, 32 not only provide support for the photovoltaic module 6 but also cooperate with the second sealant 34 to shield first and third sealants 18, 40 from ultraviolet light. Such light may cause photodegradation of the first and third sealants 18, 40.

Frame 26 is supported by base 43, which is preferably composed of steel. Frame 26 is held in place on base 43 by means of frame lock 44, cap screw 46, and lock nut 48. Cap screw 46 may be any other fastener known in the art such as a rivet, screw, and so on. Tightening lock nut 48 causes cap screw 46 to exert pressure on frame lock 44, which in turn exerts a force on frame base 50, forcing frame base 50 against base 43. Each section of frame 26 is connected at the corner by means of a metal screw 51 inserted in connecting hole 52.

Figure 3:
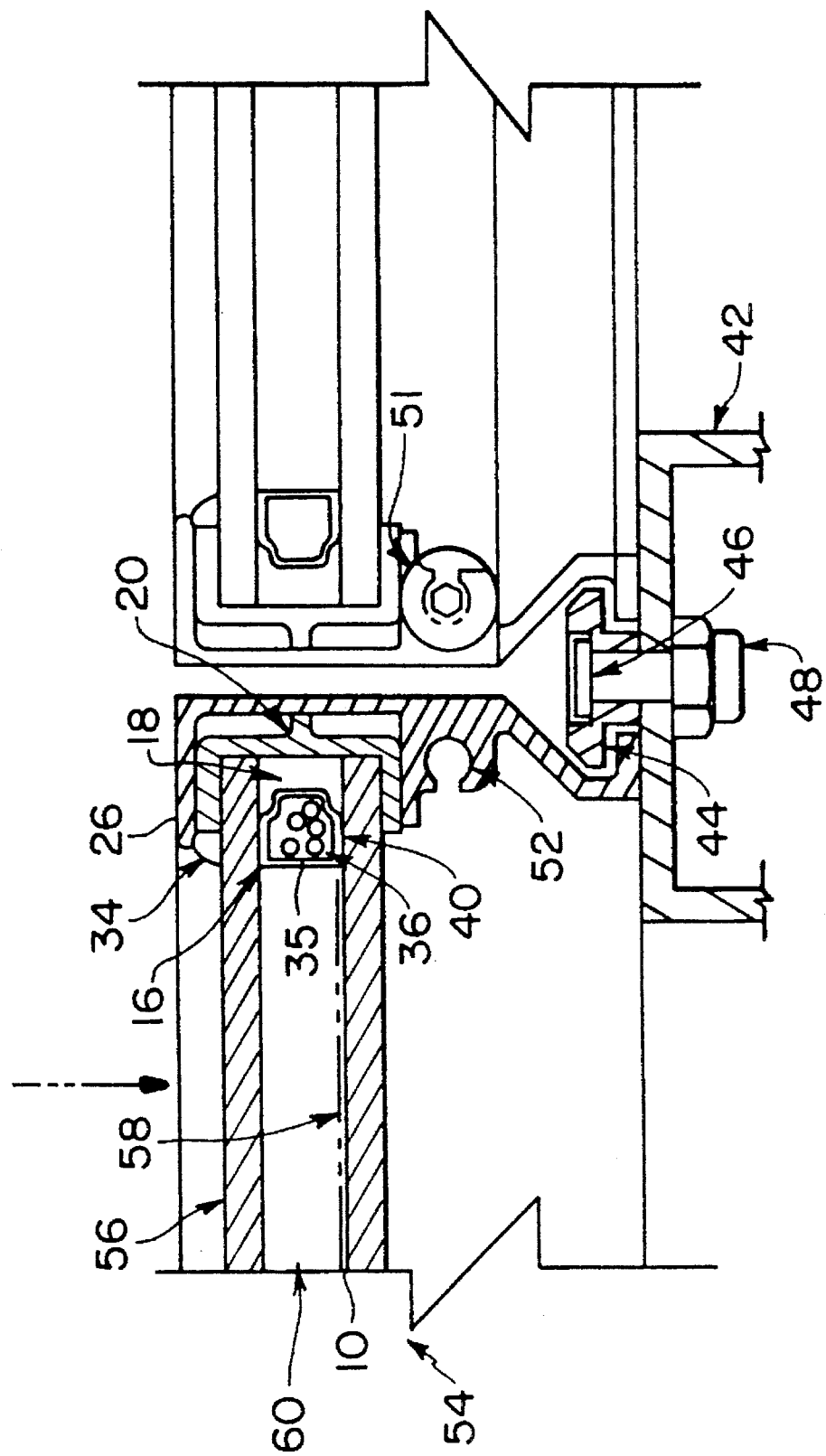
FIG. 3 is a cross-sectional view of a second embodiment of a photovoltaic module showing the use of tempered glass to absorb vertical shock.

Referring to FIG. 3, a second photovoltaic module 54 is illustrated that includes upper and lower panels 56, 58, an inner space 60, a spacer 16, first, second, and third sealants 18, 34, 40, and channel 20. Upper panel 56 is composed of tempered glass that is substantially transparent to light. Inner space 60 is left open as a vacuum or gas-filled space. It is not filled with ethyl vinyl acetate. The gas should be a substantially inert gas having few components that will adversely react with the chemicals in the thin film solar cell 10 to decrease the solar cell's efficiency. The gas contained in the space preferably contains no more than about 10 parts per million of moisture. More preferably, the gas comprises at least about 2% by volume oxygen.

Desiccant 36 is placed inside spacer 16. Thin film solar cell 10 may be deposited on the lower panel 58 in the event the upper panel contains compounds or substances, such as sodium in tempered glass, that may migrate and chemically interact with the components of a thin film solar cell 10 deposited on the upper panel 56. As shown in FIG. 3, the spacer 16 is hollow so that it can hold a desiccant 36 and has perforations 35 so that water in the inner space 60 can be absorbed by the desiccant. Many of the features of photovoltaic module 54, including without limitation, spacer 16, channel 20, frame 26, base 43, frame lock 44, cap screw 46, lock nut 48, and screw 51 are substantially the same components as the components in photovoltaic module 6 identified by the same numbers.

Figure 4:
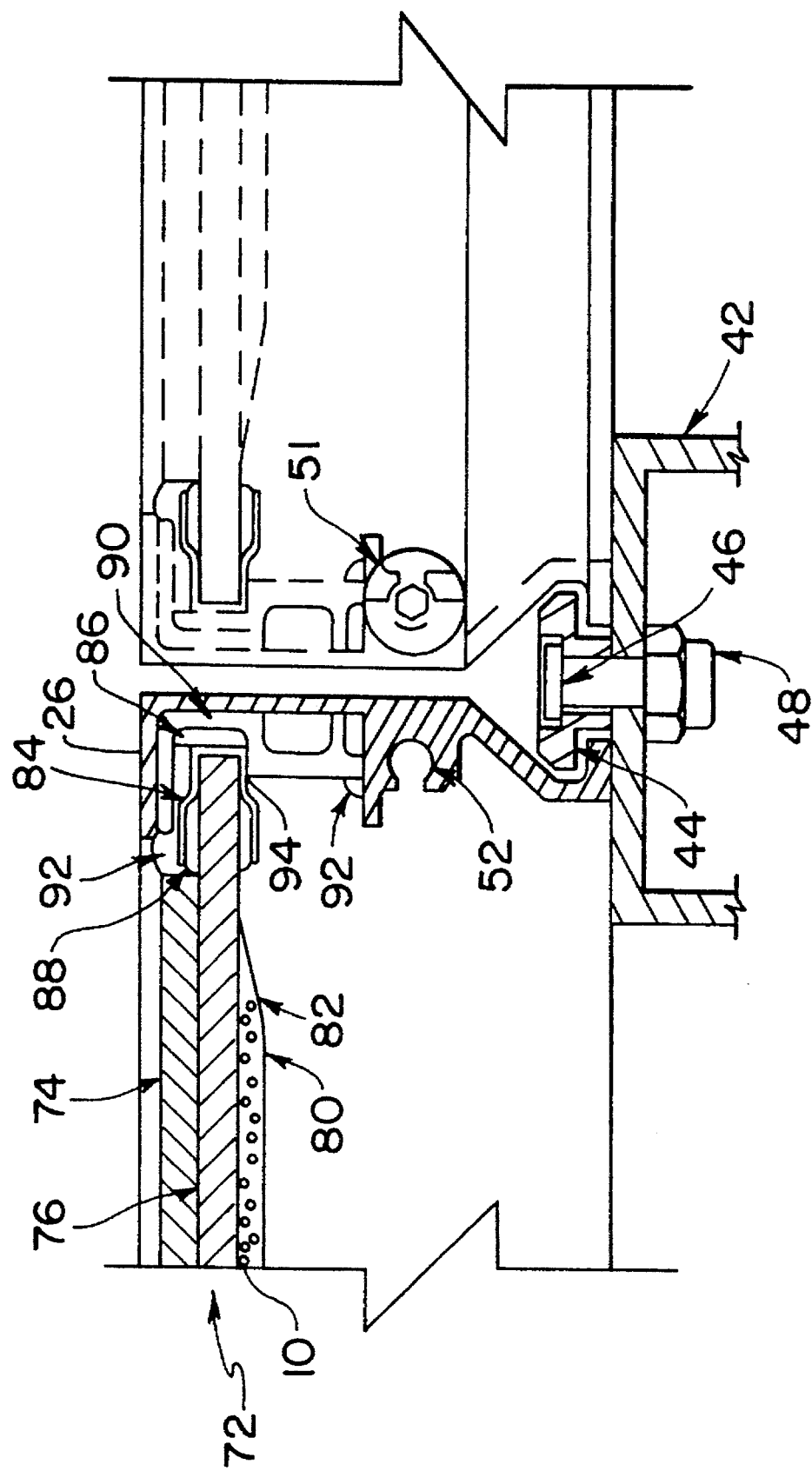
FIG. 4 is a cross-sectional view of a third embodiment of a photovoltaic module showing the stacking of panels to absorb vertical shock.

In a third embodiment of a photovoltaic module illustrated in FIG. 4, the photovoltaic module includes an upper and lower panel that are substantially transparent to light and are located substantially adjacent to one another and a solar cell located substantially adjacent to the lower surface of the lower panel. The upper panel is substantially rigid to substantially absorb forces applied to the upper panel along an axis perpendicular to the upper panel.

Referring to FIG. 4, photovoltaic module 72 includes upper and lower panels 74, 76, thin film solar cell 10, desiccant 80, undercoating 82, clip 84, and cushion 86. Upper and lower panels 74, 76 are in a stacked configuration to provide strength to one another. Upper and lower panels comprise a material having a modulus of elasticity of about $10 \times 10^6$ psi. Preferably, upper panel 74 comprises tempered glass and lower panel 76 comprises untempered glass. A gap of no more than about ¼ inches exists between the lower surface of upper panel 74 and the upper surface of lower panel 76. The magnitude of the gap depends upon the structure, composition and thickness of the upper panel 74 and the maximum probable vertical force to be exerted on upper panel 74. If the gap is too great, upper panel 74 may plastically deform or fracture in response to a vertical force before contacting and obtaining the support of lower panel 76. For such large gaps, the force exerted on upper panel 74 by gas entrapped in the gap in response to gas compression is a contributing factor to the deformation or fracturing.

Thin film solar cell 10 is deposited on the lower surface of the lower panel 76. Undercoating 82, which may be any material that is impervious to water such as rubber to protect the thin film solar cell 10 from moisture penetration. Desiccant 80 is included between solar cell 78 and undercoating 82 to provide additional protection from moisture. Clip 84 is located over the outer edge of the undercoating 82 in a pinch point configuration. Clip sealant 88 may be any water resistant material, such as polyurethane, to impede moisture penetration along the pinch point formed at the interface between the clip 84 and lower panel 76.

Bracket 90 and cushion 86 engage clip 84 to provide support. Clip 84 is held in place by the pressure exerted vertically by bracket sealant 92 and bracket edge 94 and horizontally by cushion 86. Bracket 90 is preferably composed of aluminum. Cushion 86 is preferably composed of urethane foam rollstock. Bracket sealant 92 is preferably composed of black silicone rubber. Frame 26, as discussed above, is preferably composed of aluminum. Many of the features of photovoltaic module 72, including without limitation frame 26, base 43, frame lock 44, cap screw 46, metal screw 51 and lock nut 48, are substantially the same as the components in photovoltaic module 6 identified by the same numbers.

In a fourth embodiment of a photovoltaic module, the photovoltaic module employs a desiccant to absorb and transfer forces exerted on the panel along an axis perpendicular to the panel. The fourth embodiment includes a panel that has an exterior side that is exposed to the environment and an interior side that is sealed from the environment.

Figure 5:
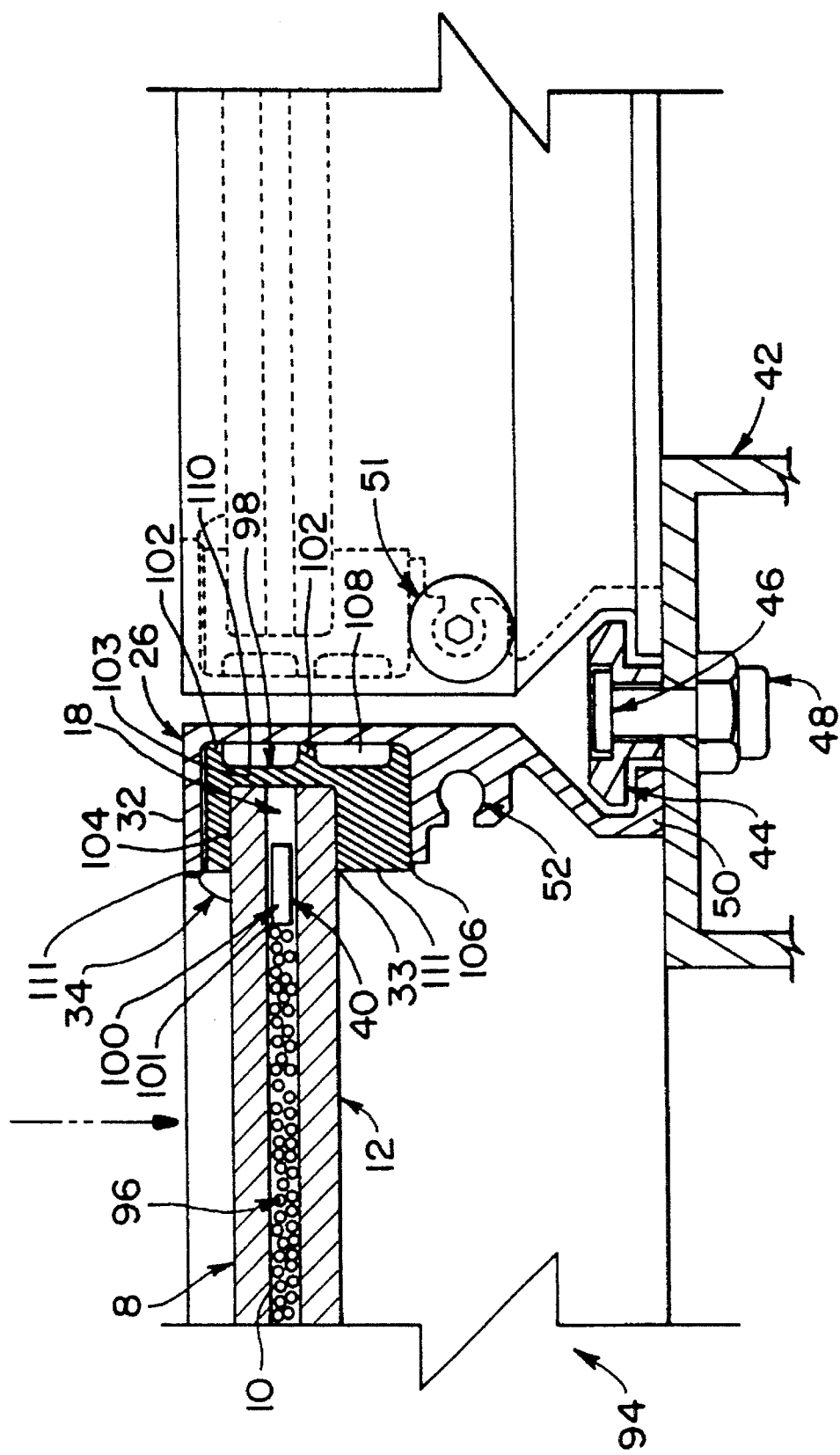
FIG. 5 is a cross-sectional view of a fourth embodiment of a photovoltaic module showing the spacer, upper and lower panels, and channels.

Referring to FIG. 5, the photovoltaic module 94 includes upper and lower panels 8, 12, thin film solar cell 10, desiccant 96, channel 98, spacer 100, first sealant 18, second sealant 34, and third sealant 40. Upper and lower panels 8, 12 may be any material impervious to water penetration. Upper panel 8 should also be capable of passing the wavelengths of light falling within the band gap of thin film solar cell 10. Preferably, upper and lower panels 8, 12 are untempered glass. The gap between upper and lower panels 8, 12 is at least 0.06 inches and no more than about 1 inch and preferably from about 0.06 to 0.095 inches. Thin film solar cell 10 is deposited on the lower surface of the upper panel 8.

Desiccant 96 is included between upper panel 8 and lower panel 12 to help absorb forces along an axis perpendicular to upper panel 8 and to transfer a portion of the force to lower panel 12. The ability of photovoltaic module 94 to withstand such forces depends upon a number of factors including the size and composition of desiccant 96, the packing density of desiccant 96, the space between upper and lower panels 8, 12, the thickness and rigidity of upper and lower panels 8, 12, and the gas pressure in the space enclosed between upper and lower panels 8, 12.

Desiccant 96 may be any desiccant that absorbs water vapor but not oxygen and that has a pore size of less than 4Å and, more preferably, 3Å. Desiccant 96 may be a thermally conductive material to reduce thermal stress on the components of photovoltaic module 94. Desiccant 96 may range from about 0.03 to 0.04 inches in diameter, preferably about 0.0394 inches in diameter.

Substantially all of the space between the upper and lower panels 8, 12 should contain desiccant. Preferably, at least 40% by volume of the space contains desiccant 96. More preferably, at least 45% by volume of the space contains desiccant and most preferably, at least 50% by volume of the space contains desiccant 96. Desiccant 96 may be placed in the space between the upper and lower panels 8, 12 after assembly of photovoltaic module 94 by means of a hole in lower panel 12 until the space is preferably full of desiccant. As it is inserted in the space between the upper and lower panels 8, 12, desiccant 96 displaces air and other gases. Desiccant 96 may be gravity fed and typically does not require compression to be capable of absorbing and transferring forces applied to upper panel 8.

The lower panel 12 should be substantially rigid and not pliable. The rigidity of the lower panel 12 is preferably the same as upper panel 8, which preferably has a modulus of elasticity of about $10 \times 10^6$ psi. If the lower panel 12 is pliable, photovoltaic module 94 will not be able to absorb forces along an axis perpendicular to upper panel 8. Lower panel 12 will not be able to absorb the force transferred to it by desiccant 96 without deformation.

The gas in the space between upper and lower panels 8, 12 is preferably at atmospheric pressure. Too high a gas pressure may cause fracturing of upper panel 8 in response to changes in altitude. Too low a gas pressure will adversely affect the transfer of force to lower panel 12 by desiccant 96. The existence of some gas pressure in the space between upper and lower panels 8, 12 improves the transfer of forces to lower panel 12 by desiccant 96.

Spacer 100 may be any material having a coefficient of thermal expansion substantially the same as one or both of upper and lower panels 8, 12. Preferably, spacer 100 is mild steel and upper and lower panels 8, 12 are glass. Spacer 100 is slightly smaller than the gap between the upper and lower panels 8, 12 to permit third sealant 40 to be used between spacer 100 and upper and lower panels 8, 12. First sealant 18 is located adjacent the outer edge of spacer 100. The distance from the inner edge 101 of spacer 100 to the outer edge 103 of the upper and lower panels 8, 12 is preferably about 0.5 inches.

Channel 98 has three nubs 102 to help absorb forces along an axis parallel to the upper and lower panels 8, 12. The additional nubs help stabilize the photovoltaic module 94 by providing three spaced points of contact between channel 98 and frame 26. Preferably, the thickness of channel 98 between the outer edge 103 of photovoltaic module 94 and channel face 110 is about 0.06 to about 0.07 inches and the height of each nub 102 measured from channel face 110 is about 0.06 to about 0.07 inches. As stated above, the cross-sectional area of nub 102 depends upon the maximum probable horizontal force to be exerted on photovoltaic module 94. For a maximum probable horizontal force of 50 pounds, each nub 102 will have a cross-sectional area of the nub face adjacent the frame 26 of about 0.026 square inches. Upper arm 104 preferably has a length from the outer edge 103 of upper panel 8 to arm face 111 of about 0.025 to about 0.27 inches and a thickness of about 0.06 to about 0.07 inches. Lower arm 106 preferably has a length from the outer edge 103 to arm face 111 of about 0.25 to about 0.27 inches and a thickness of about 0.24 to about 0.27 inches. Channel 98 may be composed of any material having a durometer shore A of about 50 to 70, preferably 60, which corresponds to the maximum probable horizontal force to be applied to the photovoltaic module 94 in most applications. Preferably, the material will comprise thermoplastics, such as rubber (preferably, EPDM (a derivative of ethylene propylene)) that can retain its properties over a module life of 20 years.

A plurality of channels 98 are spaced from one another around the perimeter of the photovoltaic module 94 to avoid moisture entrapment in gaps 108 and elsewhere adjacent to the seal established between the upper panel 8 and lower panel 12. Specifically, by being spaced from one another, the plurality of channels 98 permit moisture to drain away from the module 94 via gaps in between the channels. The number of channels 98 for each edge of the photovoltaic module 94 depends upon the shape, composition and structure of channels 98 and the maximum probable horizontal force to be applied to the photovoltaic module 94. Preferably, the spacing between channels 98 is about 3.00 to 7.00 inches. The width of each of the plurality of channels 98 is preferably about 0.25 to about 0.50 inches, and preferably 0.37 inches. Many of the remaining features of photovoltaic module 94, including without limitation, frame 26, base 43, frame lock 44, cap screw 46, screw 51 and lock nut 48 are substantially the same as the components in photovoltaic module 6 identified by the same numbers.

Several modifications may be made to each of the four photovoltaic module embodiments shown in FIGS. 1 through 5. By way of example, the embodiment shown in either FIGS. 1 and 2 or FIG. 5 may have the thin film solar cell 10 moved to lower panel 12 and upper panel 8 may be tempered glass and/or a third panel may be stacked on upper panel 8. Either configuration provides additional support from vertical forces exerted on the module along an axis perpendicular to upper panel 8 (e.g., vertical forces). The embodiment of FIG. 3 may also include a third panel stacked on upper panel 56 and/or one or more panel supports 14 to provide additional support from vertical forces. Finally, the embodiment of FIG. 4 may be equipped with a third panel in a spaced relationship below lower panel 76 together with (a) one or more panel supports 14 in the space between the panels to provide additional support from vertical forces, (b) a plurality of channels 20 to absorb forces applied to the photovoltaic module along an axis parallel to the photovoltaic module and direct water away from the photovoltaic module, and/or (c) spacer 16 having substantially the same coefficient of thermal expansion as at least one of the lower panel 76 and third panel to reduce the possibility of the seal between spacer 16 and lower panel 76 or third panel being broken by temperature fluctuations.

The present inventions offer numerous advantages over existing photovoltaic module designs. Among the advantages, the photovoltaic modules disclosed herein are capable of withstanding vertical impacts and other vertical shocks. In one of the photovoltaic modules disclosed herein, unlike known photovoltaic module configurations, the central areas of the upper panel are supported, enabling the force applied to the upper panel to be transferred quickly to the panel supports without undue leveraging of the force on the panel surface. Another advantage is the present invention's use of a plurality of button-shaped channels to divert water away from the photovoltaic module, unlike known photovoltaic module designs. Yet a further advantage is the present invention's use of a spacer having a coefficient of thermal expansion substantially equivalent to the coefficient of thermal expansion of at least one of the panels a cause of seal failure. Among the other advantages, the present invention employs pinch points to prevent water from penetrating the inner space of the photovoltaic module.

FIG. 6 depicts the fourth embodiment of the present invention employing a formed glass backcap. The formed glass backcap 113 can take the place of the lower panel 12 and spacer 16 in any of the previously described embodiments that utilize these structures. FIG. 6 shows the formed glass backcap 113 and front panel 114, with photovoltaic cells located on the underside thereof, forming a cavity that contains desiccant 10. Formed glass backcap 113 is attached to front panel 114 by fusion of the panels, either directly to one another or via a fusible glass frit, to establish a substantially hermetic seal. Alternatively, a sealant can be placed between the panels to establish a seal. Other sealing mechanisms are also feasible.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. An apparatus for converting light into electricity in a terrestrial environments comprising;

an energy generating means to convert light into electricity;

a first panel that is sealed to a second panel, said first and second panels forming an interior space between said first and second panels that is shielded from the exterior environment, said energy generating means located within said interior space; and a plurality of means, positioned in said interior space adjacent to said first panel, for resiliently absorbing a vertical force exerted on at least one of said first and second panels along an axis substantially perpendicular to at least one of said first and second panels, wherein all of said plurality of means for absorbing a vertical force are separated from one another by a space to permit deformation of each of said plurality of means for resiliently absorbing a vertical force.

2. An apparatus, as claimed in claim 1, wherein:

at least one of said plurality of means absorbs force by one of the following: compression along said axis and elongation along said axis.

3. An apparatus, as claimed in claim 1, wherein:

each of said plurality of means for absorbing forces comprises a resilient rubber material.

4. An apparatus, as claimed in claim 1, wherein:

each of said plurality of means for absorbing is attached to said second panel and detached from said first panel.

5. An apparatus, as claimed in claim 1, wherein:

said first panel is attached to said energy generating means, said energy generating means receiving light through said first panel; and each of said plurality of means for absorbing is located between said energy generating means and said second panel.

6. An apparatus, as claimed in claim 1, wherein:

said plurality of means for absorbing having substantially an even distribution over said first panel.

7. An apparatus, as claimed in claim 1, wherein:

said first panel has an interior side bounding the area defined by said interior space; and the distance between said plurality of means for absorbing forces and said interior side of said first panel is less than about 0.030 inches.

8. An apparatus, as claimed in claim 1, wherein:

said plurality of means for absorbing forces comprises a material having a displacement of about 1/32 inches at about 5.0 psi.

9. An apparatus, as claimed in claim 1, wherein:

each of said plurality of means for absorbing forces has a face adjacent to said first panel having a cross-sectional area of at least about 0.19 square inches.

10. An apparatus, as claimed in claim 1, wherein the spacing between each of said plurality of means for absorbing forces is no greater than about 6 inches.

11. An apparatus, as claimed in claim 1 wherein:

the spacing between said plurality of means for absorbing forces and the cross-sectional area of each of said plurality of means for absorbing forces is a function of the following: the composition, structure and thickness of said first panel and the maximum probable vertical force to be applied to said first panel along an axis perpendicular to said first panel.

12. An apparatus, as claimed in claim 1, further comprising:

a third panel comprising tempered glass having a lower surface located adjacent to an exterior side of said first panel;

sealing means for establishing a seal between said second panel and said first panel to create said interior space, said sealing means having substantially the same coefficient of thermal expansion as at least one of said second panel and first panel to reduce the possibility of said seal being broken and thereby exposing said energy generating means to the exterior environment;

framing means to support said third panel, first panel and second panel; and plurality of means for absorbing a force applied to at least one of said third panel, first panel, and second panel along an axis substantially parallel to at least one of said third panel, first panel, and second panel wherein at least one of said plurality of means has an interior surface that is located adjacent to said sealing means and an exterior surface that is located adjacent to said framing means and has a centrally located portion that is elevated over portions of said exterior surface located on both sides of said centrally located portion to substantially direct water away from said sealing means.

13. An apparatus for converting light into electricity in a terrestrial environment comprising: an energy generating means to convert light into electricity;

enclosure means for protecting said energy generating means from the terrestrial environment, said enclosure means includes a first panel, a second panel that is operatively connected to said first panel, and a peripheral edge, said energy generating means located between said first panel and said second panel; and frame means for holding said enclosure means about said peripheral edge, said frame means includes a first portion positioned over said first panel and a second portion positioned over said second panel, said first and second portions cooperatively constraining vertical movement of said enclosure means, said frame means further includes means for absorbing vertical shocks adjacent to said peripheral edge of said enclosure means, wherein said means for absorbing is located in between said first portion of said frame and said first panel and in between said second portion of said frame means and said second panel;

wherein said means for absorbing includes a plurality of force absorbing devices, with at least two adjacent force absorbing devices being separated by a space to permit water to flow away from said enclosure means and thereby reduce the possibility of water penetrating said enclosure means and adversely affecting said energy generating means contained therein.

14. An apparatus, as claimed in claim 13, wherein:

said frame means further includes a third portion located outside of said peripheral edge.

15. An apparatus, as claimed in claim 13, further comprising:

a third panel comprising tempered glass having a lower surface located adjacent to an upper side of said first panel;

sealing means for establishing a seal between said first and second panels wherein said sealing means has substantially the same coefficient of thermal expansion as at least one of said first and second panels to reduce the possibility of said seal being broken and thereby exposing said energy generating means to the exterior environment; and plurality of means for absorbing a force applied to at least one of said first, second and third panels along an axis substantially parallel to at least one of said panels, wherein at least one of said plurality of means has an interior surface that is located adjacent to said sealing means and an exterior surface that is located adjacent to said frame means and has a centrally located portion that is elevated over portions of said exterior surface located on both sides of said centrally located portion to substantially direct water away from said sealing means.

16. An apparatus, as claimed in claim 13, wherein:

said energy generating means absorbs light passing through said second panel.

17. An apparatus for converting light into electricity in a terrestrial environment comprising:

a first panel that is transparent to light and has a first upper surface that is exposed to the exterior environment and a first lower surface that is shielded from the exterior environment;

a second panel that is separate from said first panel, with a space located between said first and second panels, said second panel being transparent to light and having a second upper surface and a second lower surface that is shielded from the exterior environment with said second upper surface being located adjacent to said first lower surface of said first panel; and an energy generating means located adjacent to said second lower surface of said second panel, wherein said energy generating means receives light that passes through said first and second panels;

wherein said first panel is rigid to absorb forces applied to said first panel along an axis perpendicular to said first panel and wherein said first panel is composed of a material having a modulus of elasticity of at least about $10 \times 10^6$ psi.

18. An apparatus, as claimed in claim 17, wherein:

said first and second panels comprise glass.

19. An apparatus, as claimed in claim 17, wherein:

the distance between said first lower surface of said first panel and second upper surface of said second panel is no greater than about 0.25 inches.

20. The apparatus, as claimed in claim 17 further comprising:

a third panel located below said second lower surface to form a space containing said energy generating means;

framing means to support said first, second and third panels;

sealing means for establishing a seal between said second and third panels to create a substantially closed environment for said energy generating means that is protected from the exterior environment, said sealing means having substantially the same coefficient of thermal expansion as at least one of said second and third panels to reduce the possibility of said seal being broken and thereby exposing said energy generating means to said exterior environment;

plurality of means, located within the area bounded by said second and third panels and said sealing means, for absorbing a vertical force exerted on said first panel along an axis perpendicular to said panel; and plurality of means, located in between said sealing means and said framing means, for absorbing a force applied to at least one of said first, second and third panels along an axis substantially parallel to at least one of said first, second, and third panels, wherein at least one of said plurality of means has an interior surface that is located adjacent to said sealing means and an exterior surface that is located adjacent to said framing means and having a centrally located portion that is elevated over portions of said exterior surface located on both sides of said centrally located portion to substantially direct water away from said sealing means.

21. An apparatus, as claimed in claim 17, wherein:

all of the first lower surface of said first panel and all of the second upper surface of said second panel are substantially flat.

22. An apparatus for converting light into electricity in a terrestrial environment comprising:

a first panel that is transparent to light and has a first upper surface that is exposed to the exterior environment and a first lower surface that is shielded from the exterior environment;

a second panel that is separate from said first panel, with a space located between said first and second panels, said second panel being transparent to light and having a second upper surface and a second lower surface that is shielded from the exterior environment with said second upper surface being located adjacent to said first lower surface of said first panel; and an energy generating means located adjacent to said second lower surface of said second panel, wherein said energy generating means receives light that passes through said first and second panels;

wherein said first panel comprises tempered glass.

23. An apparatus for converting light into electricity in a terrestrial environment comprising;

an energy generating means to convert light into electricity;

a means for protecting said energy generating means, said means for protecting includes a first panel comprising substantially transparent tempered glass that has an exterior side which is exposed to the exterior environment and an interior side that is shielded from the exterior environment and a second panel spaced from said interior side of said first panel, said energy generating means being located adjacent to said interior side of said first panel, wherein said tempered glass protects said energy generating means from projectiles in said exterior environment;

means for absorbing shocks from said projectiles located adjacent to at least one of said first and second panels; and a space between said first panel and said energy generating means.

24. An apparatus, as claimed in claim 23, wherein:

said space contains a selected gas.

25. An apparatus, as claimed in claim 24, wherein:

said gas comprising at least 2 percent by volume oxygen.

26. An apparatus, as claimed in claim 23, wherein:

said space is substantially a vacuum.

27. An apparatus as claimed in claim 23, wherein:

said space contains a gas at a selected pressure to transfer a portion of the shock from said projectiles to said second panel located below said first panel in said protecting means.

28. An apparatus, as claimed in claim 23, wherein:

said first panel comprises a material having a modulus of elasticity of about $10 \times 10^6$ psi.

29. An apparatus, as claimed in claim 23, further comprising:

a third panel comprising tempered glass having a lower surface located adjacent to said exterior side of said first panel;

framing means to support said first, second, and third panels;

plurality of means, located within said space, for absorbing a vertical force exerted on said third panel along an axis perpendicular to said third panel;

means for sealing said first panel and said second panel to form said space; and plurality of means, located in between said means for sealing and said framing means for absorbing a force applied to at least one of said first, second, and third panels along an axis substantially parallel to at least one of said first, second, and third panels, wherein at least one of said plurality of means has an interior surface that is located adjacent to said means for sealing and an exterior surface that is located adjacent to said framing means and has a centrally located portion that is elevated over portions of said exterior surface located on both sides of said centrally located portion to substantially direct water away from said means for sealing; and wherein said means for sealing has substantially the same coefficient of thermal expansion as at least one of said first and second panels to reduce the possibility of said seal being broken and thereby exposing said energy generating means to said exterior environment.

30. An apparatus, as claimed in claim 23, wherein:

said absorbing means includes a plurality of shock absorbing devices.

31. An apparatus, as claimed in claim 23, wherein:

said protecting means has a peripheral edge; and further comprising:

frame means for holding said protecting means about said peripheral edge, said frame means includes a portion positioned over at least one of said first and second panels and said absorbing means is located between said frame means portion and said protecting means.

32. An apparatus, as claimed in claim 31, wherein:

said frame means includes a first portion positioned over said first panel and a second portion positioned over said second panel, said first and second portions cooperatively constraining vertical movement of said protecting means, wherein said absorbing means is located between said first panel and said first portion of said frame means and said second panel and said second portion of said frame means.

33. An apparatus, as claimed in claim 32, wherein:

said absorbing means includes a plurality of shock absorbing devices with at least two adjacent shock absorbing services being separated by a space to permit water to flow away from said protecting means and thereby reduce the possibility of water penetrating said protecting means and adversely affecting said energy generating means contained therein.

34. An apparatus for converting light into electricity in a terrestrial environment comprising:

a photovoltaic panel that includes a photovoltaic cell and means for enclosing said photovoltaic cell to protect said photovoltaic cell from fluids in the external environment;

a framing means to support said photovoltaic panel; and a plurality of means, located in between said photovoltaic panel and said framing means, for absorbing a force applied to said photovoltaic panel along an axis substantially parallel to said photovoltaic panel with a space between at least two adjacent means for absorbing a force so that said at least two adjacent force absorbing means do not abut one another, said space permitting water to flow away from said photovoltaic panel and thereby reducing the possibility of water penetrating said means for enclosing and adversely affecting said photovoltaic cell contained therein.

35. An apparatus, as claimed in claim 34, wherein:

at least one of said plurality of means having an interior surface that is located adjacent to said photovoltaic panel and an exterior surface that is located adjacent to said framing means and having a centrally located portion that is elevated over portions of said exterior surface located on both sides of said centrally located portion to substantially direct water away from said photovoltaic panel.

36. An apparatus, as claimed in claim 34, wherein:

at least one of said plurality of means includes means for absorbing a force applied to said photovoltaic panel along an axis that is substantially perpendicular to said photovoltaic panel.

37. An apparatus as claimed in claim 34, wherein:

said plurality of means for absorbing a force comprises a material having a durometer shore of about 50 to 70.

38. An apparatus,,as claimed in claim 34, wherein:

the distance between each of said plurality of means for absorbing a force is about 3.0 to 7.0 inches.

39. An apparatus, as claimed in claim 34, wherein:

each of said plurality of means for absorbing a force have a width of no less than about 0.25 inches.

40. An apparatus, as claimed in claim 34, wherein said photovoltaic panel movably connects each of said means for absorbing a force to form an interface along which gases and liquids may travel.

41. An apparatus, as claimed in claim 34, wherein:

said means for enclosing includes first and second panels and sealing means located in between said first and second panels, for establishing a seal between said panels, said sealing means having substantially the same coefficient of thermal expansion as at least one of said panels to reduce the possibility of said seal being broken and thereby exposing said photovoltaic cell to said exterior environment and further comprising;

a third panel comprising tempered glass having a lower side located adjacent to the upper side of said first panel; and plurality of means, located in the space bounded by said means for enclosing, for absorbing a vertical force exerted on said third panel along an axis perpendicular to said third panel.

42. An apparatus, as claimed in claim 34, wherein:

said photovoltaic panel has a peripheral edge and a portion of said framing means is located outside of said peripheral edge.

43. An apparatus for converting light into electricity in a terrestrial environments comprising:

a photovoltaic panel that includes a photovoltaic cell and means for enclosing said photovoltaic cell to protect said photovoltaic cell from fluids in the external environment;

framing means to support said photovoltaic panel; and means, located in between said photovoltaic panel and said framing means, for absorbing a force applied to said photovoltaic panel along an axis substantially parallel to said photovoltaic panel, said means for absorbing having an interior surface that is located adjacent to said photovoltaic panel and an exterior surface that is located adjacent to said framing means and having a centrally located portion that is elevated over portions of said exterior surface located on both sides of said centrally located portion.

44. An apparatus, as claimed in claim 43, wherein:

a plurality of means for absorbing is located in between said photovoltaic panel and said framing means to permit water to flow away from said photovoltaic panel.

45. An apparatus, as claimed in claim 43, wherein:

said means for enclosing includes first and second panels and sealing means, located in between said panels, for establishing a seal between said panels, said sealing means having substantially the same coefficient of thermal expansion as at least one of said panels to reduce the possibility of said seal being broken and thereby exposing said energy generating means to said exterior environment and further comprising:

a third panel comprising tempered glass having a lower side located adjacent to the upper side of said first panel; and plurality of means, located in the space bounded by said means for enclosing for absorbing a vertical force exerted on said third panel along an axis perpendicular to said third panel.

46. An apparatus for converting light into electricity in a terrestrial environment comprising:

an upper panel being substantially transparent to light;

a lower panel spaced a desired distance from said upper panel;

an energy generating means to convert light into electricity that is located between said upper and lower panels and responsive to light that passes through said upper panel; and sealing means for establishing a seal between said upper and lower panels to create a substantially closed environment for said energy generating means that is protected from the exterior environment, said sealing means having a different composition than at least one of said panels and has substantially the same coefficient of thermal expansion as at least one of said panels to reduce the possibility of said seal being broken and thereby exposing said energy generating means to said exterior environment.

47. The apparatus, as claimed in claim 46, wherein:

said sealing means has substantially the same coefficient of thermal expansion as said upper panel.

48. The apparatus, as claimed in claim 46, wherein:

said sealing means has substantially the same coefficient of thermal expansion as said lower panel.

49. The apparatus, as claimed in claim 46, wherein:

said sealing means has substantially the same coefficient of thermal expansion as both said upper panel and said lower panel.

50. The apparatus, as claimed in claim 46, wherein:

said upper panel comprises glass and said sealing means comprises stainless steel.

51. The apparatus, as claimed in claim 46, wherein:

said upper panel comprises glass and said sealing means comprises glass.

52. The apparatus as claimed in claim 46, further comprising:

a first panel comprising tempered glass having a lower side located substantially adjacent to the upper side of said upper panel;

framing means to support said first, upper, and lower panels;

plurality of means, located in the space bounded by said upper and lower panels and said sealing means, for absorbing a vertical force exerted on said first panel along an axis perpendicular to said first panel; and plurality of means, located in between said sealing means and said framing means, for absorbing a force applied to at least one of said first, upper, and lower panels along an axis substantially parallel to at least one of said first, upper, and lower panels, wherein at least one of said plurality of means for absorbing parallel forces has an interior surface that is located adjacent to said sealing means and an exterior surface that is located adjacent to said framing means and a centrally located portion that is elevated over portions of said exterior surface located on both sides of said centrally located portion to substantially direct water away from said sealing means.

* * * * *